US006852201B2

United States Patent
Hermeler et al.

(10) Patent No.: US 6,852,201 B2
(45) Date of Patent: Feb. 8, 2005

(54) SPUTTER TARGET AND METHOD OF USING A SPUTTER TARGET

(75) Inventors: Bernd Hermeler, Aachen (DE); Alexander Wuropulos, Aachen (DE)

(73) Assignee: CemeCon AG (DE)

( * ) Notice: Subject to any disclaimer, the term of this patent is extended or adjusted under 35 U.S.C. 154(b) by 0 days.

(21) Appl. No.: 10/344,128

(22) PCT Filed: Aug. 7, 2001

(86) PCT No.: PCT/EP01/09119
§ 371 (c)(1),
(2), (4) Date: Feb. 7, 2003

(87) PCT Pub. No.: WO02/12584
PCT Pub. Date: Feb. 14, 2002

(65) Prior Publication Data
US 2003/0173216 A1 Sep. 18, 2003

(51) Int. Cl.⁷ ................................. C23C 14/34
(52) U.S. Cl. .................. 204/192.12; 204/298.12; 204/298.13
(58) Field of Search ................ 204/192.12, 298.12, 204/298.13

(56) References Cited

U.S. PATENT DOCUMENTS 4,610,774 A * 9/1986 Sakata et al. .......... 204/298.12
4,915,810 A * 4/1990 Kestigian et al. ...... 204/298.04

FOREIGN PATENT DOCUMENTS

| DE | 465699 | 9/1928 | |
| DE | 29 14618 C2 | 10/1980 | |
| JP | 8-158047 | * 6/1996 | ........... C23C/14/34 |

OTHER PUBLICATIONS

EPO Abstract 61291969, Dec. 22, 1986.*
English translation of JP 61–291969.*
Patent Abstracts of Japan vol. 011, no. 163 (C–424), May 26, 1987 & JP 61 291969 A (Matsushita Electric Ind Co Ltd), Dec. 22, 1986.
Patent Abstracts of Japan, vol. 011, no. 185 (C–428), Jun. 13, 1987 & JP 62 007852 A (Toshiba Corp), Jan. 14, 2987.
Patent Abstracts of Japan, vol. 006, no. 122 (C–112), Jul. 7, 1982 & JP 57 047871 A (Hitachi Ltd), Mar. 18, 1982.
Z. Liu et al.. "Oxidation behavior of nanocrystalline Fe–Ni–Cr–Al alloy coatings", Materials Science and Technology, Dec. 1999, pp. 1447–1450. vol. 15.

* cited by examiner

Primary Examiner—Steven VerSteeg
(74) Attorney, Agent, or Firm—Banner & Witcoff, Ltd.

(57) ABSTRACT

A sputtering target used in carrying out a PVD coating process where the sputtering target is sputtered by bombardment with gas atoms and a layer consisting of several metallic elements is deposited onto a substrate, the sputtering target being a plate made of a metal used for building up the layer, and with the other metals used for building up the layer being present at least partially in the form of plugs, which are inserted in holes in the plate, the shape of the free surfaces of the plugs being selected in such a way that the sputtering rate for each metal used in the sputtering process can be set according to the desired composition of the layer being applied.

8 Claims, 2 Drawing Sheets

SPUTTER TARGET AND METHOD OF USING A SPUTTER TARGET

Figure 1:
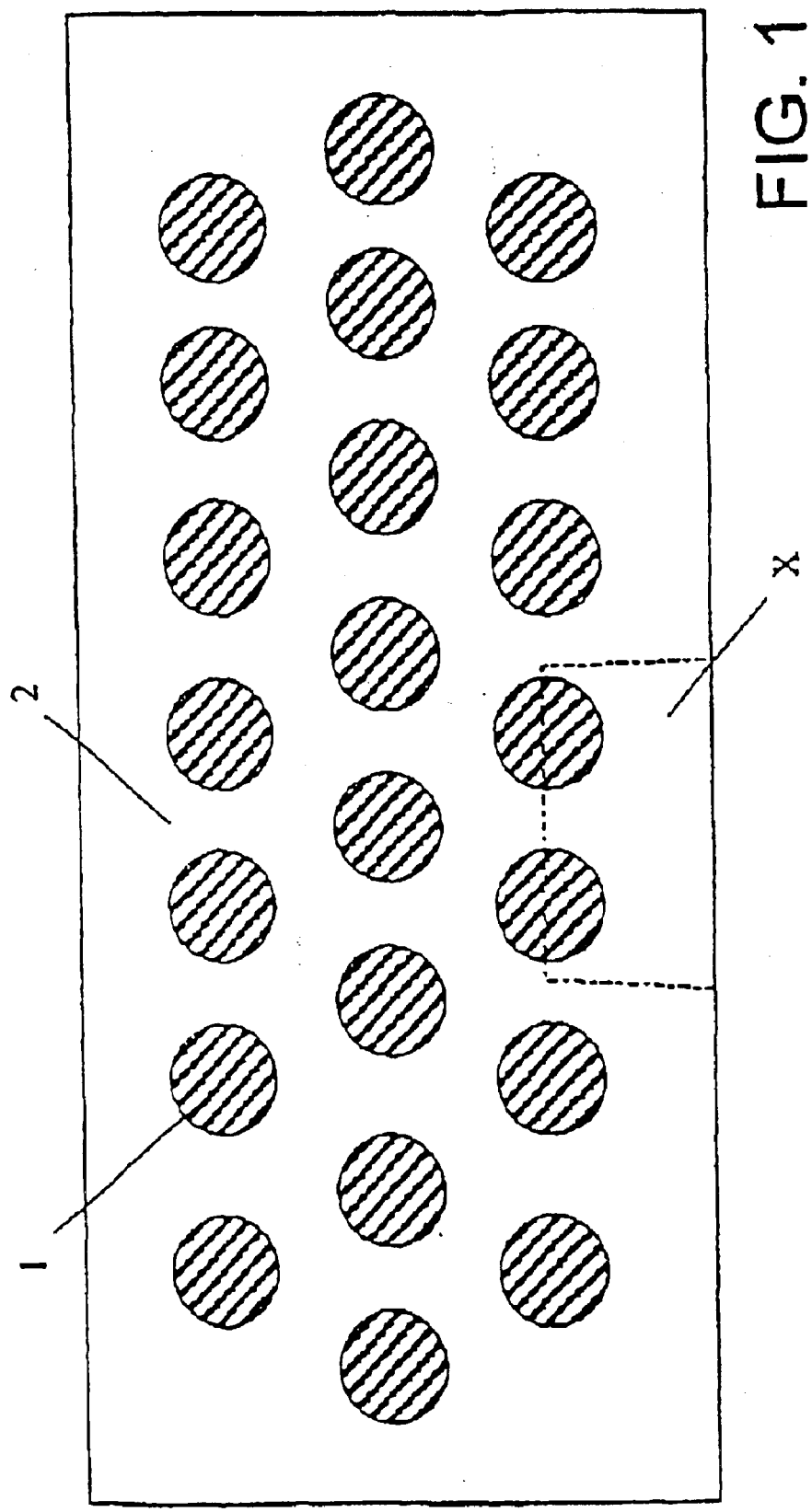

This is a U.S. National Phase Application Under 35 USC 371 and applicant herewith claims the benefit of priority of PCT/EP01/09119 filed 7 Aug. 2001, which was published Under PCT Article 21(2) in English, and German Application No. 100 39 478.7 filed 8 Aug. 2000.

The invention relates to a sputtering target for carrying out a PVD coating process and a PVD coating process where the sputtering target is sputtered by bombardment with gas atoms and/or ions and a layer consisting of several metallic elements is deposited on the substrate, the sputtering target being a plate made of one of the metals used for building up the said layer, with the remaining metals used for building up the layer at least partly in the form of plugs, which are inserted into holes in the plate.

A target structured in this way is generally referred to as a "mechanical sputtering target". Before a PVD coating process is carried out, the sputtering target is fitted to a cathode on the equipment used for carrying out the process and is electrically connected to this cathode. For this reason, the sputtering target possesses the same electrical potential as the cathode attached to this equipment.

As a result of bombardment with gas ions, atoms from the plate itself and the plugs in the plate are removed from the surface of the sputtering target as dust to enter the gas phase. The sputtered-off metal atoms are separated from the gas phase and deposited on to the surface of a substrate, such as an indexable insert or a twist drill. In this way, the different types of metal atoms are applied to the substrate in a certain ratio, thus guaranteeing the stoichiometry of the layer being applied.

If, for example, a Ti/Al sputtering target is used and a normal TiAlN coating layer is to be applied to the substrate, the two metals can be present in a ratio of 1:1, the overall layer being composed of 25 at % Ti, 25 at % Al and 50 at % N.

With a sputtering target of this type, the plate consists of titanium, while the plugs are of aluminium. In the case of previously known mechanical sputtering targets, the surface to be treated is flat—i.e. the free surfaces of the plugs lie flush with the surface of the plate itself.

The disadvantage of a known sputtering target of this type is that, at the beginning of the cathode sputtering process, the ratio (e.g. between sputtered-off titanium and aluminum atoms) required for building up the desired layer is not achieved. The sputtering rates do not reach the required ratio until after a lengthy starting period (often of several hours' duration) for the sputtering target. This means that the material that is already being sputtered off the plate and plugs during the run-in phase is wasted, as it cannot be used in the actual coating process.

In the case—for example—of a mechanical sputtering target with a titanium plate and aluminium plugs, it can be noticed during bombardment of the target that the sputtering rate for aluminium is considerably higher than that of titanium. For this reason, the plugs wear down at a faster rate than the plate itself. The result of this is that a large part of the plate material remains intact after the plugs have been completely worn away.

DE-A-2914618 contains a description of a process for the application of a sliding or friction surface to a substrate by means of cathode sputtering. The targets used in this process are objects with a circular cross-section, in which the materials used to form the sliding surface are combined, the object being made of a matrix material with holes containing plugs made of other materials.

The article "Oxidation behaviour of nanocrystalline Fe—Ni—Cr—Al alloy coatings" by Z. Liu, W. Gao and Y. He, published in the December 1999 issue of "Materials Science and Technology", Vol. 15, page 1447 ff describes a coating process involving Fe—Ni—Cr—Al alloys, which uses magnetron—sputtering technology. The article cites the use of a target with a diameter of 150 mm and a thickness of 6 mm, the eight plugs inserted into the target being of pure aluminium and of 8 mm in diameter, in order to create Fe—Ni—Cr—Al alloy coatings.

DE-A465699 describes a process for the coating of a substrate by means of cathode sputtering, along with a cathode (target) used for this purpose. In order to create a regular alloy coating consisting of two or more materials on the substrate, the target used consists of a metal plate made of one metal, in which pins of a second metal are inserted into holes. These pins can be used for fixing plates of the second material to the surface. It is indicated that correct adjustment of the ratio of the free surfaces can be used to create the desired coating.

It is the object of the invention to obtain a sputtering target that is more viable and cost-effective when carrying out a PVD coating process with cathode sputtering.

This object is achieved, in the case of the item initially referred to as the sputtering target, by selecting the shape of the free surface of the plugs in such a way that the sputtering rates for each metal required for the desired coating composition are achieved when sputtering the target.

The teaching of the invention consequently involves using the shaping of the free surfaces of the plugs to take into account the different sputtering rates of the metals of the plate and the plugs. Consequently, if the sputtering rate for the plug material is greater than the sputtering rate for the plate material, the free surface of the plugs runs inwards relative to the surface of the plate. In this way, the drill holes in the plate act as a screen for the gas atoms/ions as they hit or leave the sputtering target. For this reason, the actual sputtering rate for the plug metal is reduced to such an extent that the sputtering rates required for the desired substrate-coating composition are reached both for the plate metal and the plug metal.

If, however, the sputtering rate for the plug material is smaller than the sputtering rate for the plate material, the free surface of the plugs preferably runs outwardly relative to the surface of the plate.

In comparison to prior sputtering targets, the sputtering target that is the subject of this invention requires no run-in time—thus resulting in a more cost-effective use of sputtering-target material.

The plate can be made of a single metal. It is however also possible to use a plate made of alloy material. The material used for the plugs can vary from plug to plug. The selection of materials depends exclusively on the composition of the layer being applied to the substrate.

Typical combinations of plate and plug materials include titanium/aluminium, titanium/zirconium and titanium/carbon, the last material listed being plug material. When carbon is used as a plug material, the plug has a lower sputtering rate than the titanium used to make the base-plate. In this case, the plug would protrude from the surface of the plate by the corresponding amount.

It is normally preferable that the actual desired sputtering rate of the plug material is set by selecting the amount by which the plug sinks into or protrudes out of the holes in the plate.

It is not absolutely vital that the free surface of each plug should lie exactly flush with the surface of the plate.

Experiments have nevertheless shown that it is preferable for the free surfaces of the plugs to form a single surface with that of the plate, the free surfaces of the plugs being curved inwards or outwards relative to the plate. In other words, the free surfaces of the plugs should be linked to the surface of the plate. The curvature of the free surface of the plugs corresponds, as already described above, to the sputtering-rate ratio of the plate material to the plug material.

The holes should preferably be circular in cross-section, while the radius of curvature of the surfaces of the plugs should maintain a ratio, with respect to the diameter of the hole, of 1.5:1 to 2.5:1.

In the case of a plug diameter of 15 mm for an aluminium plug in a titanium plate, the best coating conditions are obtained if the radius of curvature of the free surface of the aluminium plugs has been kept within a range of 25 to 35 mm.

If the plug has to be deformed to obtain the desired amount of surface curvature, it is preferred that the plug material is softer than the material of which the base-plate is made.

The base-plate (which can be made of such materials as titanium, chrome, stainless steel, vanadium, nickel, zirconium, hafnium, tantalum or carbon) is attached—as known in the art—to a cooling plate, which is normally made of copper.

The cost-effective use of the sputtering target is also increased by making the plugs protrude from the main plate and into holes in the cooling plate (in cases where the plug material wears down faster than the plate material). In the case of a titanium plate with aluminium plugs, the plate can be 5 mm thick, while the plugs are 7 mm long, thus leaving 2 mm of aluminium plug free to protrude into the cooling plate.

After using a sputtering target of this type to apply layers to substrates, an optimum amount of titanium is consumed from the plate, despite the higher sputtering rate of aluminium—with 1 mm (for example) of aluminium plug still remaining in the cooling plate. It is not possible to consume all the titanium in the plate, as a surrounding trough is formed, during the coating process, between the central area of the sputtering target and its edge (magnetron target), which is due to the sputtering process in the sputtering target. Once the depth of the trough coincides with the thickness of the base-plate, the sputtering target is no longer usable.

Special attention is drawn to the fact that the method of making the plugs protrude into the cooling plate supposes advantages in itself, quite apart from the items described above with respect to the invention. For this reason, the configuration of a sputtering target of the type described initially (with plugs protruding into the cooling plate) is regarded as a separate solution of the object of this invention.

The protrusion of the plugs into the cooling plate offers the additional advantage of more effective cooling of the plug material. In particular, this layout also prevents plate material getting between the cooling plate and plugs while the cathode sputtering process is being carried out. This is of special advantage if the plate material possesses low heat conductivity (as with titanium, for example).

Different configurations of the invention are further-explained below with the aid of drawings. Items illustrated:

FIG. 1 Top view of a sputtering target

Figure 2:
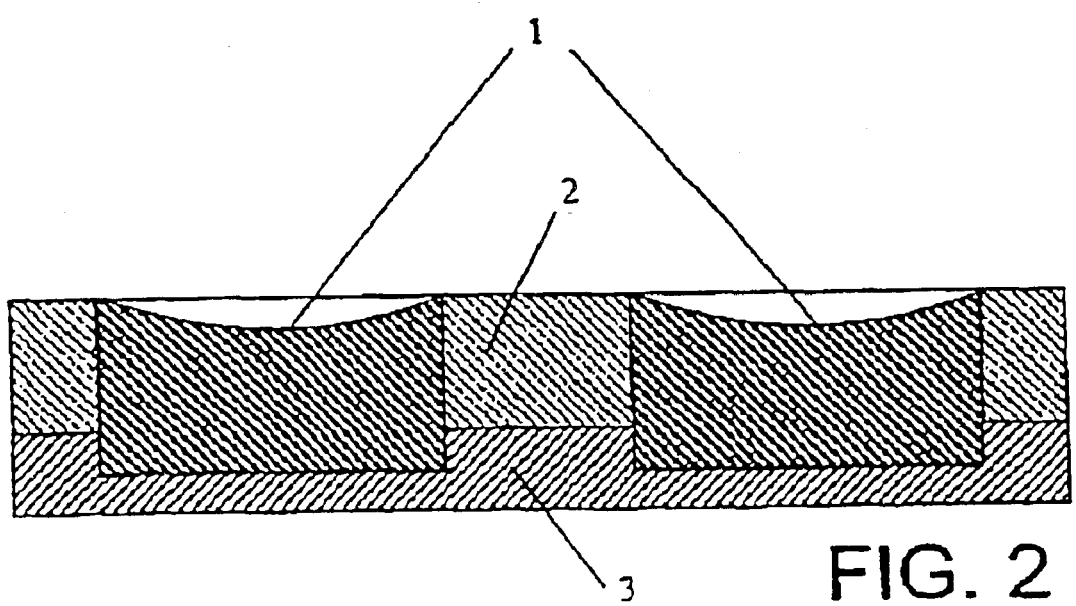

FIG. 2 Partial cross-sectional view of a sputtering target with plugs (which have a curved free surface) protruding into a cooling plate.

A typical sputtering target consists of a titanium base-plate, with holes for pressing in the aluminium plugs. The sputtering target is about 90 mm wide and can be between 100 mm and 800 mm long. Other dimensions are available as required.

The number of aluminium plugs used depends on the proportion of aluminium required in the chemical composition of the coating to be used for treating the substrate. The proportion of aluminium in the sputtering target can be between 1 and 50 at %.

The plugs typically measure 15 mm in diameter, while base-plate thickness can range from 5 mm to 8 mm.

FIG. 1 shows a Ti/Al sputtering target with titanium as base-plate material and plugs made of aluminium. The aluminium plugs (1) are evenly distributed across the surface of the titanium base-plate (2).

FIG. 2 shows the section of the sputtering target that is marked with an "X" in FIG. 1. As the cross-sectional view shows, the aluminium plugs (1) have a concave free surface relative to the base-plate (2). The free surface of the plugs (1) lies flush with the surface of the base-plate (2). The plugs (1) protrude into holes in the cooling plate (3). The amount of protrusion ensures optimum use of the sputtering target during the cathode sputtering process—despite the different sputtering rates of titanium and aluminium. The purpose of the cooling plate (3), which is made of copper, is to dissipate the heat produced—during the sputtering of the sputtering target—on the side of the target that is being subjected to the sputtering process.

The skilled person selects a concave or convex curvature for the plugs used in each combination of materials for the base-plate (2) and plugs (1), in order to obtain the desired sputtering rate.

In the example of a Ti/Al sputtering target, the aluminium plugs protrude by at least 1.5 mm into the cooling plate (3), which is between 3 mm and 6 mm thick. This shape of the inserted plugs is selected here because—with regular bombardment of gas atoms and/or ions—the plug material (in this case: aluminium) possesses a high sputtering rate than the plate material (in this case: titanium). The sunken shape of the surface means that fewer gas atoms and/or ions actually hit the plug material, with the ring-shaped section of surrounding plate-material acting as a screen.

The skilled person is familiar with the sputtering rates of the various materials used. With these rates in hand, the required shape of the surface for each combination of plate and plug materials can be determined.

What is claimed is:

1. Sputtering target for carrying out a PVD coating process where the sputtering target is sputtered by bombardment with gas atoms and/or ions such that a layer including metallic elements is deposited on a substrate, the sputtering target comprising a plate comprising a plurality of holes, said plate being formed of a material having a sputtering rate and including at least one of the metallic elements for depositing on the substrate for forming the layer, and a plurality of plugs, each said plug positioned in a respective one of said holes in said plate, said plugs being formed of a material including at least one metal for forming the layer, said material of said plugs having a sputtering rate that is different than said sputtering rate of said material of said plate, each said plug having a free surface that forms a single surface with a surface of said plate, wherein said free surface of each said plug is curved outwardly relative to said surface of said plate when the sputtering rate of the plate is greater than the sputtering rate of the plugs and curved inwardly relative to the surface of said plate when the sputtering rate of the plate is less than the sputtering rate of the plugs.

2. Sputtering target according to claim 1, wherein said holes are of circular cross-section and the radius of curvature of the free surfaces of the plugs relative to the hole diameter lies within a ratio of 1.5:1 to 2.5:1.

3. Sputtering target according to claim 2, wherein the plate is made of titanium and the plugs are made of aluminum.

4. Sputtering target according to claim 3, wherein the hole diameter is 15 mm and the radius of curvature of the free surfaces of the aluminum plugs lies within a range of 25 mm to 35 mm, the free surfaces of the plugs being curved inwards relative to the plate.

5. Sputtering target according to claim 1, wherein the plugs in the plate protrude out from said holes and into the cooling plate so as to attach the plate to said cooling plate.

6. Sputtering target for carrying out a PVD coating process where the sputtering target is sputtered by bombardment with gas atoms and/or ions such that a layer including metallic elements is deposited on a substrate, the sputtering target comprising a first plate comprising a plurality of holes, said first plate being formed of a material including at least one of the metallic elements for depositing on the substrate for forming the layer, and a plurality of plugs, each said plug positioned in a respective one of said holes in said first plate and protruding from said holes and into a cooling plate such that said cooling plate is attached to said first plate by said plugs, said plugs being formed of a material including at least one metal for forming the layer.

7. Sputtering target according to claim 6, wherein the plugs in the first plate protrude by at least 1.5 mm into the holes in the cooling plate.

8. A method of PVD coating, said method comprising the steps of:

bombarding a sputtering target with gas atoms and/or ions;

depositing a layer including several metallic elements onto a substrate, said sputtering target comprising a plate comprising a plurality of holes and being formed of a material including at least one of the metallic elements for depositing on the substrate for forming the layer, and a plurality of plugs, each said plug being positioned in a respective one of said holes in said plate;

choosing the shape of a free surface of said plugs according to the sputtering rates of the plug and plate material such that the free surface of each plug is curved inwardly relative to the surface of the plate when the sputtering rate of the plug material is higher than the sputtering rate of the plate material, and the free surface of each plug is curved outwardly relative to the surface of the plate when the sputtering rate of the plug material is lower than the sputtering rate of the plate material; and forming a single layer between the free surface of the plugs and an upper surface of the plate.

* * * * *